United States Patent [19]
Theodoulou et al.

[11] Patent Number: 5,142,248
[45] Date of Patent: Aug. 25, 1992

[54] PLURAL SELECTABLE RF OSCILLATORS FOR SUPPLYING CAPACITIVE LOADS

[75] Inventors: Sotos M. Theodoulou, Bramalea; William K. Baker, Toronto, both of Canada

[73] Assignee: Delphax Systems, Ontario, Canada

[21] Appl. No.: 792,420

[22] Filed: Nov. 15, 1991

[51] Int. Cl.$^5$ .............................................. H03B 5/08
[52] U.S. Cl. ........................................ 331/46; 331/49; 331/149; 331/173; 346/154
[58] Field of Search .................. 331/46, 49, 112, 146, 331/149, 173; 346/154, 159

[56] References Cited
U.S. PATENT DOCUMENTS
4,841,313  6/1989  Weiner ................................ 346/159

Primary Examiner—Siegfried H. Grimm
Attorney, Agent, or Firm—Lahive & Cockfield

[57] ABSTRACT

An oscillation circuit having multiple separately addressable oscillator stages for applying RF voltage across selected capacitive loads where each stage includes a power driver, a transformer and a quench/clamp circuit. The oscillation circuit includes one enablement circuit responsive to an externally applied enablement signal and address signal and a common feedback circuit connected between one end of all of the transformers and the enablement circuit. An externally applied address signal and an enable signal selects a particular oscillator stage and initiates action of a power/driver circuit to provide an initial pulse of AC current through the associated transformer for a preset period and the feedback circuit detects negative zero crossovers of the waveform of current through that transformer primary to maintain actuation of the driver circuit for as long as the external enable signal is present.

5 Claims, 5 Drawing Sheets

PLURAL SELECTABLE RF OSCILLATORS FOR SUPPLYING CAPACITIVE LOADS

BACKGROUND OF THE INVENTION

This invention relates in general to an oscillator circuit for providing a gated burst of RF voltage from a step-up transformer across a capacitive load, and more particularly to such an oscillator in which, after initiation, the RF burst is triggered by detection of waveform zero crossings of the current through the transformer primary, oscillating at the resonant frequency of the circuit defined by the secondary inductance of the transformer and the capacitive load, to provide a signal back to the triggering point for the circuit.

In conventional blocking oscillators it is typical that several cycles are required at the initiation of the oscillation before the voltage reaches its peak-to-peak maximum. There are, however, some applications in which it is necessary that there be a very sharp rise in the RF voltage to its maximum value from the time of triggering of the oscillation. One such application arises in ion or electron deposition printing in which a number of closely spaced RF electrodes are included within a cartridge and by selective application of RF drive voltages for specific periods to one or more of the RF electrodes, charge transfer from the electrode to a rotating drum is achieved. Control signals are applied to select the timing and location of the drive voltages to appropriate electrodes thereby generating on the drum surface a specific pattern of charge distribution. The charge distribution on the drum surface can thereafter be used to retain toner, the coated drum then serving as the printing element. In such an arrangement the precision of the charge pattern laid down on the drum will depend upon the precision with which the electrodes are energized both in terms of time and in terms of space. Thus, sharply defined bursts of RF voltage, both in terms of the initial rise time and the termination of that burst, enables the drive RF bursts to be applied in more rapid sequence as well as clearly defining the number of charge generating periods. A fast "fall" time of the RF envelope is needed to closely "pack" RF activation cycles. Also, if a slow rise or fall time of the RF envelope exists, neither the number of ionization periods nor the quantity of ion generation can be guaranteed, since if a number of cycles occur during this slow rise and fall, those cycles which are less than full amplitude, are ambiguous as to the amount of ionization (if any) that they contribute. This is also important to avoid cross talk. Cross talk occurs when the energy of one driven stage (RF oscillator) is coupled into the secondary tank of another RF oscillator (which is supposedly inactive). This coupling (typically capacitive) will cause the second RF oscillator to produce an erroneous output which may become sufficiently large to drive the ionization process in an electron beam printing system.

One oscillating circuit to overcome some of these difficulties has been described in U.S. Pat. No. 4,841,313. The RF driver design in that patent attempted to improve the envelope of the RF output by using a variable period one-shot scheme to control its operation. By providing a wide initial current pulse through the primary of the transformer used to form the driver, a large amount of energy can be stored in the resonant tank of the secondary inductance and capacitive load during the first cycle of operation as opposed to slowly building up the energy in the tank circuit as is the case with a blocking oscillator. Subsequent drive pulses are narrower and are initiated at the negative going zero-crossing of the AC component of the primary waveform. The limitation of this method is that the period of the one-shot is not well controlled nor is the termination of a drive pulse related to the driver output waveform phase or voltage, which results in poor output regulation, supply voltage sensitivities and stage-to-stage variability.

It is therefore an object of the present invention to provide for an oscillating circuit characterized by the ability to produce a burst of RF voltage across a capacitive load with precise timing for reproducible burst durations and where both the leading edge and the termination edge of that burst exhibit a sharp voltage change from the inactive condition to application of full voltage and vice versa.

It is another object of this invention to provide an oscillating circuit, including multiple separately addressable oscillators within it each energizing separate transformers across separate capacitive loads.

It is yet another object of this invention to provide a cycle gated RF oscillator circuit having multiple separately addressable oscillators within it in which oscillation at an addressed one of said oscillators is initiated by a fixed duration pulse and subsequent oscillation is maintained by feedback from a phase lead network generating a drive signal phase locked with the negative going slope of the initial and subsequent oscillations.

It is still another object of this invention to provide output decoupling for multiple separately addressable oscillator stages to prevent cross talk and allow a common feedback mechanism for the control of a multiple oscillator circuit.

SUMMARY OF THE INVENTION

Broadly speaking, in the gated oscillator circuit of the present invention, oscillation is initiated by a single pulse of specific duration applied to an addressed power driver circuit which supplies current through the primary of an associated transformer having its secondary coupled across a capacitive load. Typically the load is one of a series of RF electrodes. Each of the electrodes is driven by separately addressable oscillator stages, each stage including a power driver, a current sink, a quench/clamp circuit and a transformer. After the termination of the initial pulse, the current through the transformer primary is maintained by a feedback circuit which provides successive drive signals to the power driver, which signals are phase locked with the negative going slope of the primary waveform to maintain sustained oscillation at the resonant frequency determined by the transformer secondary inductance and the capacitance of the load. Each oscillator stage quench/clamp circuit damps out the oscillator at the end of an enable period, based on a signal provided from an external source to the oscillator circuit, together with address pulses for selecting the specific oscillating stage to be energized. This arrangement prevents cross talk between the series of oscillators and allows a single feedback network to be employed for multiple oscillators.

DESCRIPTION OF PREFERRED EMBODIMENTS

Figure 1:
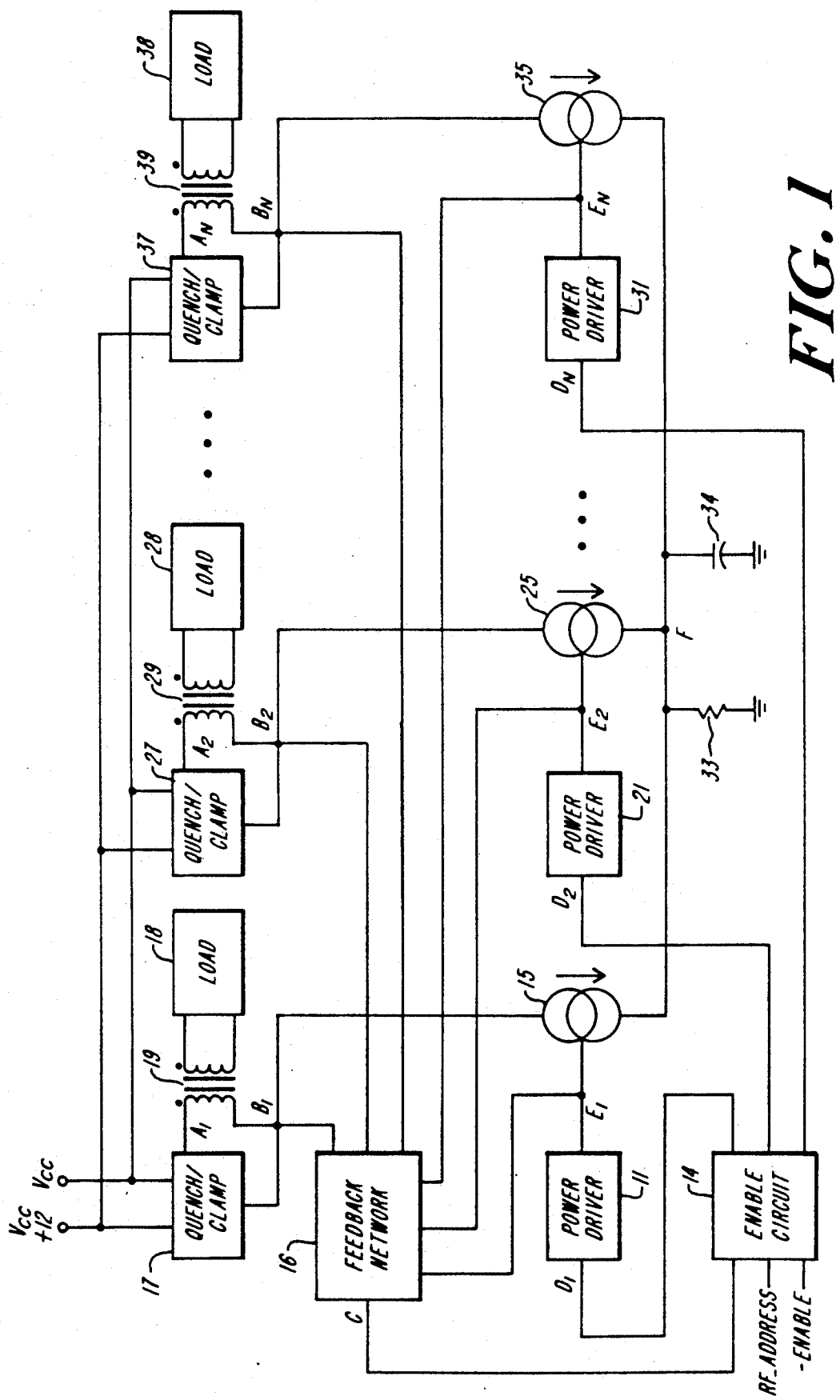
FIG. 1 is an illustration in block diagrammatic form of an oscillator circuit constructed in accordance with the principles of this invention.

FIG. 1 illustrates in block diagrammatic form a multistage cycle driven RF oscillator. Each stage of the oscillator is provided with an individual power driver, current sink, quench/clamp circuit and step-up transformer to provide, when enabled, RF energy to a specific load. The overall circuit configuration also includes a common feedback network and a common enable circuit. Typically, the initial stage shown in FIG. 1 includes power driver 11, current sink 15, which would most usually be a MOSFET transistor, a quench/clamp circuit 17 providing current to transformer 19, the secondary of which is connected across capacitive load 18. Similar additional stages are shown in FIG. 1. The selection of which stage is energized at a particular time is controlled by an RF address input to the enable circuit 14 to control the stage which is addressed at any particular time.

In general the enable circuit 14, when initiated, provides an output signal to power driver 11 which provides its output signal for a predetermined period of time. After the initial activation of the power driver by the enable circuit, continuing energization of the power driver is provided by feedback network 16 responding to the negative going AC component of the transformer primary current to initiate another drive pulse. This power drive input signal is then phase locked with the negative going slope of the primary waveform and terminates at a value close to the minimum primary voltage. The operating frequency of the oscillator is defined by the circuit formed by the transformer 19 secondary inductance and the capacity of the load. Resistor 33 renders the individual oscillator outputs less sensitive to the transconductance of the MOSFET transistor used to form the current sink 15 et al. Capacitor 34 provides a bypass so that a strong first cycle is achieved when each oscillator stage is activated.

Figure 2:
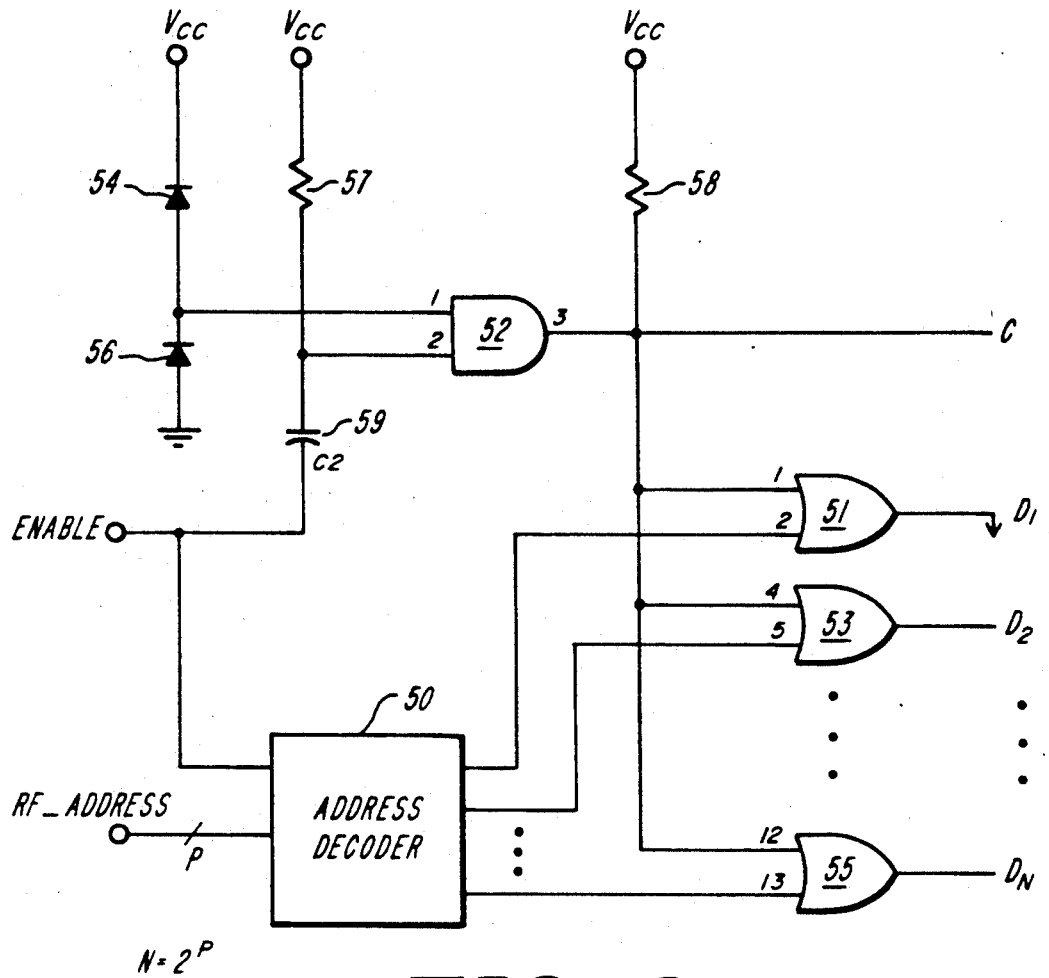
FIG. 2 is an illustration in schematic form of an enablement circuit suitable for use in the oscillator circuit of FIG. 1.

FIG. 2 is a schematic illustration of the enable circuit 14 of FIG. 1. The purpose of the enable circuit is to provide, in response to two externally applied signals, a means for selectively addressing particular stages and to gate oscillator operation on and off at specific times. The two externally applied signals are an !ENABLE signal and a program controlled address input signal having P bits, where the number of stages n in the oscillator $=2^P$. The enable circuit includes an address decoder 50 which may be a conventional decoder circuit responsive to the address input to provide an output to a specific one of the OR gates 51, 53 and 55. A second input to the address decoder is from the !ENABLE terminal which provides that the address signal to the OR gates is only generated when the !ENABLE signal is in the "ON" condition (active).

The !ENABLE terminal is also coupled through capacitor 59 as one input to AND gate 52. A second input to AND gate 52 is provided from the bottom of pull up resistor 57 which is connected to a voltage source $v_{CC}$. Voltage source vCC is also connected to ground through diodes 54 and 56 with the second input to AND gate 52 being connected to a voltage point between the diodes. This input arrangement provides that when the !ENABLE signal is initiated (made active) by the voltage at the terminal being driven low, a single fixed period pulse appears at the output of AND gate 52. When this pulse is present and any of the OR gates 51, 53, up to 55 is selected, the result is a logic low output from the selected OR gate to activate the appropriate input $D_K$ to the driver circuits.

The voltage point C of the feedback circuit 16 is also connected as an input to the OR gates. Accordingly, if either the output of AND gate 52 or the voltage point C goes low, while the !ENABLE signal is applied to the address encoder 50, then the address selected OR gate produces a logic low signal at the input $D_K$ of the connected driver stage.

Figure 3:
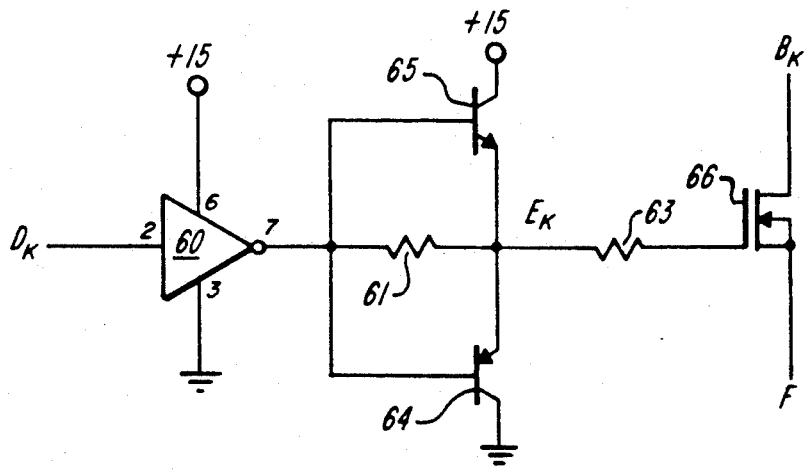
FIG. 3 is an illustration in schematic form of a driver circuit suitable for use in the oscillator of FIG. 1.

FIG. 3 is a schematic illustration of a driver stage. The driver stage includes an inverting buffer 60 providing a positive output when the input voltage point $D_K$ goes to logic low. The output of the driver $E_K$ controls the gate of common source connected MOSFET 66 acting as a current sink for the particular stage. Resistances 61 and 63 prevent parasitic oscillations. The turning on of the current sink 66 draws current through the primary of the corresponding one of the transformers (for example, transformer 29 in stage 2).

Figure 4:
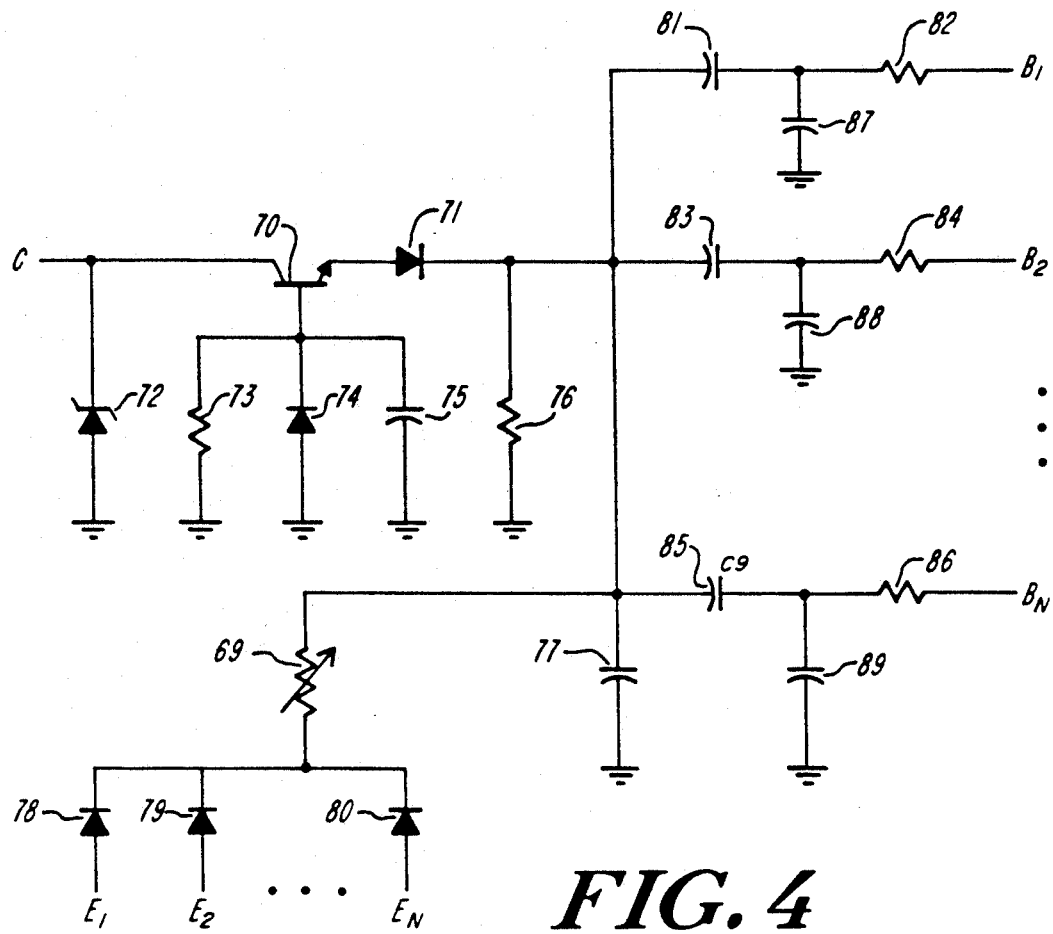
FIG. 4 is an illustration in schematic form of a feedback circuit suitable for use in the oscillator circuit of FIG. 1.

FIG. 4 is a schematic illustration of the feedback network 16 for the oscillator. The feedback network 16 is common to all of the stages. The feedback network is coupled between voltage $B_K$ at the bottom of each of the transformer primaries and the voltage point C at the input of the enable circuit 14. The purpose of the feedback network is to provide continuation of the enablement of the selected drive circuit in specific phase relation with the oscillator waveform at the transformer as long as the !ENABLE terminal remains active. The RC network extending from point $B_l$, for example, includes capacitors 81 and 87 and resistor 82, together with capacitor 77 and resistor 76. This RC network forms an attenuation circuit to block DC voltage and provide a large phase lead. Transistor 70 is connected as a common base amplifier to serve as a non-saturating switch in a sub-circuit which includes not only the transistor but also capacitor 75, resistor 73, and diodes 71, 72 and 74. In the operation of this circuit, when the slope of the AC component of the voltage at $B_K$ becomes negative, current is drawn from point C in a path through transistor 70 so that the potential at point C drops as current is drawn through pull up resistor 58 (in FIG. 2). Because of the large phase lead from the attenuation circuit, transistor 70 conducts for almost the entire period that the slope of the AC waveform at $B_K$, for the addressed one of the stages, remains negative. The transistor 70 only ceases to conduct substantially at the negative peak of the AC component at the cathode of diode 71.

As indicated previously in the discussion of the !ENABLE circuit when point C goes negative, another cycle of energization of the power drive circuit takes place. Because of the delays associated with the logic devices of this oscillator, the drive pulse will not terminate at the negative peak of the RF cycle but lags this by several nanoseconds. This timing can be improved so that the drive pulse terminates more closely to the peak of the RF cycle by placing a resistance 69 between the output $E_K$ from the driver circuit and the cathode of diode 71 through diodes 78, 79 etc. As a result of circuit delays, phase lead and attenuation of feedback network and the effect of resistor 69 the feedback circuit then provides for driving the potential point C negative essentially at the negative zero crossing of the oscillating waveform across the primary of the transformers thereby maintaining the driver output to the selected stage, once initiated, for as long as the !ENABLE pulse remains at the input to the !ENABLE terminal. The termination of the !ENABLE pulse then terminates the operation of the oscillation circuit, and hence of the current supply to the selected RF electrode.

Figure 5:
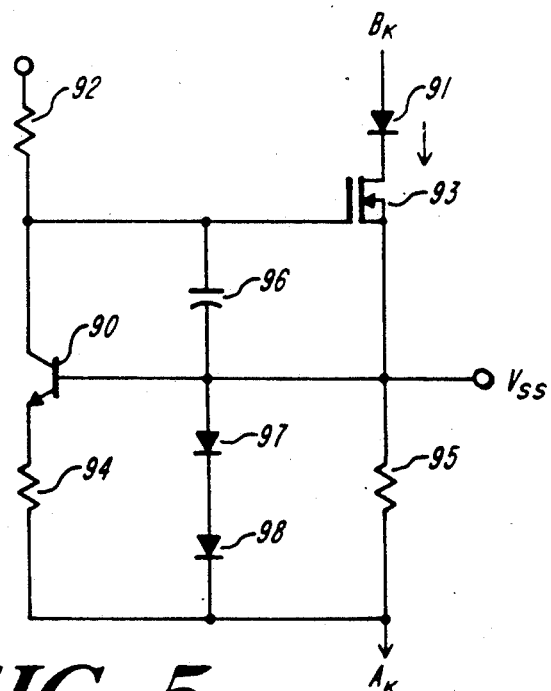
FIG. 5 is an illustration in schematic form of a quench and clamping circuit for use in the oscillator circuit of FIG. 1.
Figure 6A:
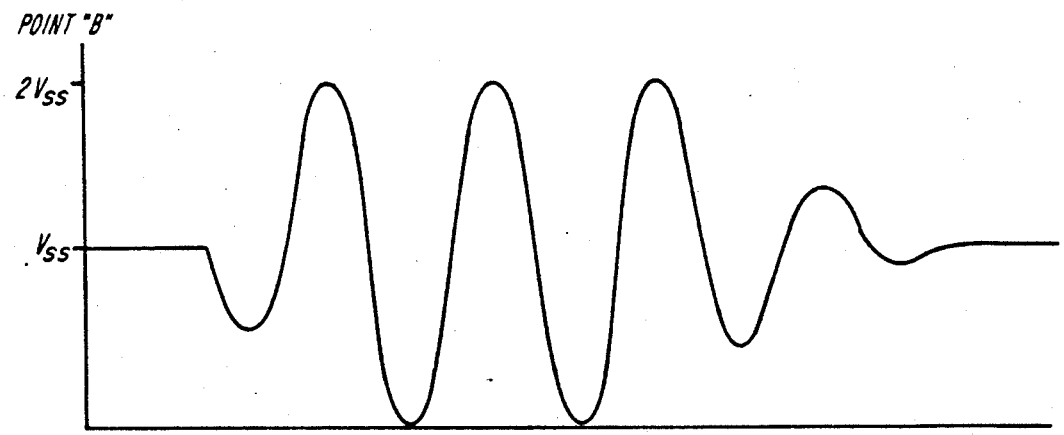
FIGS. 6a through 6f are a graphical representations of voltage as a function of time at several points in the circuit of FIG. 1.
Figure 6B:
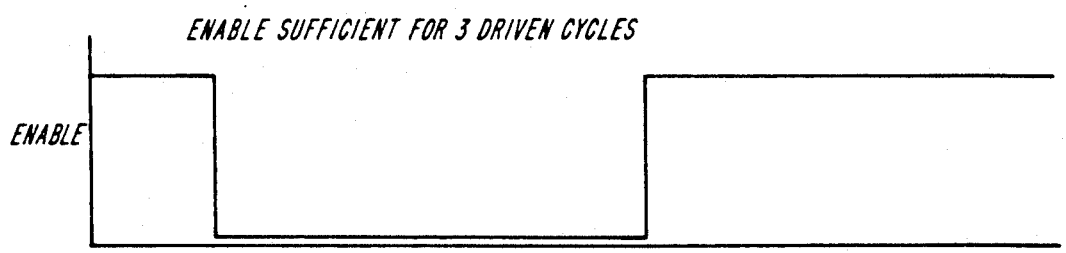
Figure 6C:
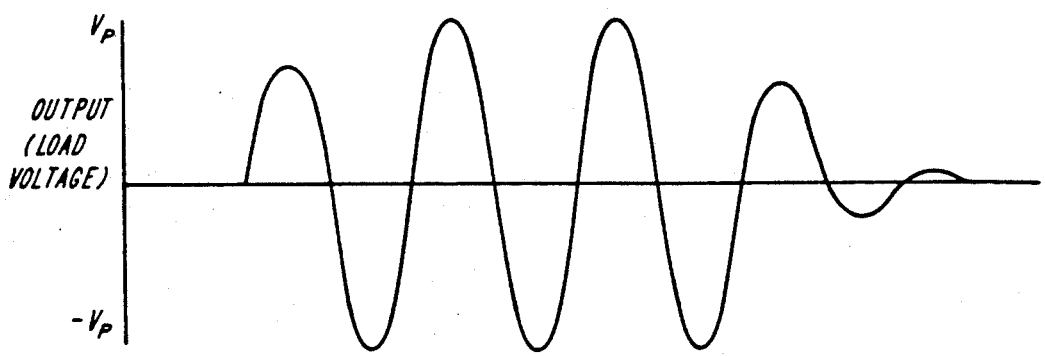
Figure 6D:
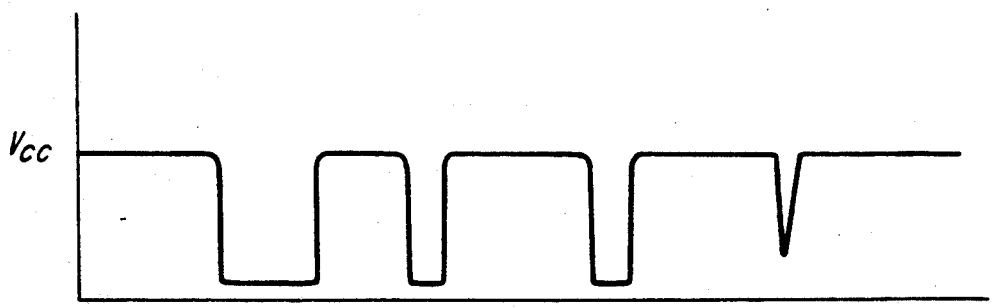
Figure 6E:
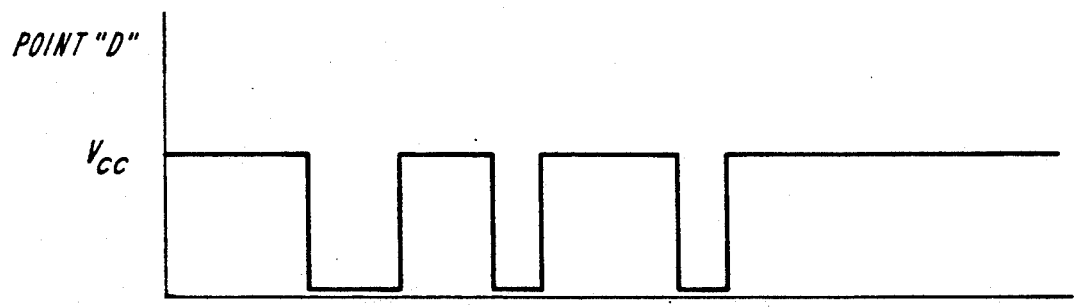
Figure 6F:
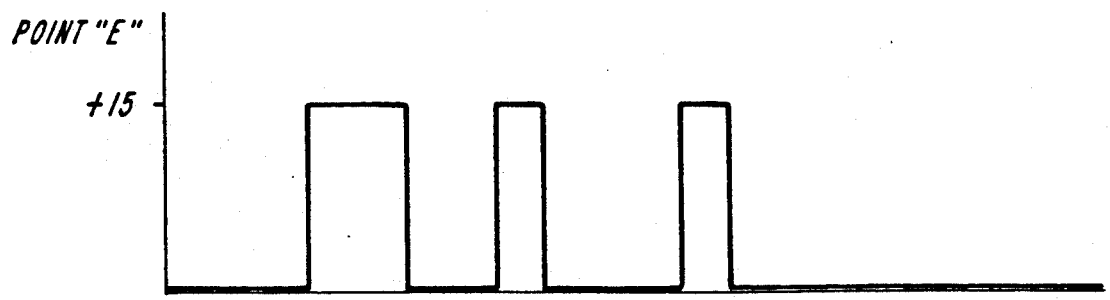

FIG. 5 is a schematic illustration of the quench/clamp circuit. The circuit typically includes a MOSFET transistor 93 coupled in series with a diode 91 and resistor 95 across the primary of the associated transformer of that stage. The source of the transistor 93 is connected to a voltage supply $V_{SS}$. The base of a second transistor 90 is coupled directly to the voltage supply $V_{SS}$, with the collector of that same transistor being coupled through resistor 92 to a supply $V_{SS}+12v$. The emitter of transistor 90 is connected through resistor 94 to one end $A_K$ of the associated transformer primary.

When the specific oscillator stage is inactive the RF transformer primary (across voltage points $A_K$ and $B_K$) is effectively connected across the diode 91. This arrangement provides half cycle clamping when any AC waveform appears across the transformer primary, either from cross talk from another stage or after the end of the !ENABLE period for the specific stage. Diode 91 prevents any clamping action taking place through the intrinsic diode of transistor 93 when the oscillator stage is active, that is when the transistor 93 is turned off. The circuit then provides for a rapid decay of the RF envelope across the RF transformer thus allowing a sharper termination of the RF pulse at the termination of the !ENABLE signal. This, in turn, allows for RF pulses to be applied with less time between them to selected RF electrodes. The suppression of cross talk which results from the action of this circuit also allows a common feedback circuit to be used for multiple driver stages.

When the oscillator stage is selected and enabled, the initial current through the primary of the transformer provides a voltage drop across resistor 95 causing transistor 90 to conduct, thereby discharging capacitor 96 and the gate capacitance associated with transistor 93, turning that transistor off. At the completion of the drive pulse transistor 90 turns off thereby allowing capacitance 96 and the capacitance associated with transistor 93 to recharge at a rate determined by the time constant of these two capacitances, together with the resistance 92. This time constant is chosen so that transistor 93 remains off for a sufficient period of time to ensure that quenching action does not occur during an active cycle. The multiple cycles of RF generation produced by the action of the feedback circuit keep capacitor 96 and the gate of transistor 93 sufficiently discharged for the duration of the entire RF burst period. When the !ENABLE signal is removed from the input to the oscillation circuit then transistor 93 turns on and the quench/clamp mode of this stage becomes active.

The operation, then, of the oscillator circuit illustrated in FIG. 1 is such that when an !ENABLE signal is applied to it, an initial fixed period pulse is transmitted from the !ENABLE circuit 14 to the addressed one of the power driver circuits (for example driver 21), establishing the resonant oscillation across the transformer secondary. The resulting reflected decrease of potential point $B_K$ is detected by the feedback network, causing the potential at point $D_K$ to fall, thereby continuing the action of the power driver circuit maintaining the current through the primary of the transformer and thus maintaining the oscillation for the entire Period that the !ENABLE pulse is supplied to the oscillation circuit. Also, the current flow through the primary of the transformer causes the quench/clamp circuit associated with that stage to become disabled. When the ringing in the transformer secondary reflects back to force the voltage at $B_K$ to rise, the feedback network is no longer able to sink current and the potential at point C rises and, providing that the initial pulse from the !ENABLE circuit to the driver has ended, terminates the drive pulse. The secondary continues to ring and when the AC component of the voltage at $B_K$ starts to decrease, the feedback network begins to conduct forcing the potential at C to decrease, producing another drive pulse. The pattern is repeated as long as the externally applied !ENABLE signal is active. When the !ENABLE signal is made inactive, the feedback network does not initiate any more pulses and the quench/clamp circuit provides for sharp termination of the RF burst to the load.

With this circuit, because the drive pulses to the power device of the driver are controlled by the primary waveform for both their initiation and termination, the sensitivity to component variances is reduced since the timing is dependent only on the primary waveform and not on any RC network. As discussed above, the envelope of the RF waveform is roughly square, characterized by a fast initial rise and a sharp terminating drop, thereby allowing for optimal packing of a series of RF bursts from different drivers into one printing mechanism, facilitating high imaging rates.

Having described the invention various additions and improvements will become apparent to those skilled in the art. This invention is to be construed as limited only by the accompanying claims.

What is claimed is:

1. An oscillator circuit for selectively applying voltage across any selected one of a series of capacitive loads with the waveform of the applied voltage being characterized by a sharp rise time to its maximum value at initiation of the enablement of the oscillation circuit and a sharp fall time from that maximum voltage at the termination of the enablement period, comprising,
    a plurality of oscillator stages, each of said stages including
    (a) a transformer having its secondary coupled across one of said capacitive loads,
    (b) a driver circuit which, when energized, applies a pulsed current to said transformer primary,
    (c) an enablement circuit responsive to an externally applied address signal and an external enable signal to selectively address an appropriate one of said oscillator stages and to provide an activating signal to said selected stage driver circuit for generating an initial predetermined period of time of current flow through said selected stage transformer primary, a feedback network coupled between one end of said transformer primary and said enablement circuit to maintain activation of said selectively addressed one of said oscillation stage driver circuits in response to the slope of the AC component of the waveform at said one end of said transformer primary going negative, to maintain said activation continuously for as long as said external enable signal is applied to said enablement circuit.

2. An oscillator circuit in accordance with claim 1 further including a quench circuit coupled across each of said transformer primaries providing half cycle clamping across said transformer primary whenever said associated oscillator stage is not enabled.

3. An oscillator in accordance with claim 1 wherein said enablement circuit comprises, an address decoder having a multiple bit input and multiple output terminals, a plurality of gates having first and second input terminals, each gate having said first input terminal connected to one of said address decoder output terminals, means responsive to the initiation of said externally applied enable signal to supply to said second input terminals of all of said gates a signal for an initial predetermined period of time, said address decoder being responsive to said externally applied address signal to select one of said multiple output terminals and produce through said selected output terminal a signal to said first input of its connected gate, said feedback network also supplying to said second input terminal of all of said gates a signal, upon termination of said initial predetermined period of time, and for so long as said external enable signal is applied to said enablement circuit, each of said gates providing an output activating signal to its associated driver circuit in response to simultaneous application of signals at its first and second inputs.

4. An oscillation circuit for applying, in response to an externally applied enable signal and an externally applied address signal, RF voltage across a selected one of a plurality of capacitive loads comprising, a plurality of oscillator stages each separately addressable according to said externally applied address signal when said external enable signal is applied, each oscillator stage including, a power driver circuit, a transformer having a primary and a secondary winding, said secondary winding being connected across the associated one of said capacitive loads, an enablement circuit coupled to said externally applied enable signal and address signal and providing to one of said power drivers selected in accordance with said applied address signal, an actuating signal for a predetermined period of time upon initiation of said enablement signal, a feedback circuit connected between each of said transformer primaries and said enablement circuit, said feedback circuit detecting negative going zero crossovers of the current waveform through any one of said transformer primaries and transmitting said detected zero crossover to said enablement circuit to maintain actuation of the selected power driver as long as said external enable signal is applied.

5. A quench/clamp circuit for providing half-cycle clamping across a transformer primary comprising, a first transistor coupled in series with a first diode across said transformer primary, a voltage supply, a second transistor coupled between said first transistor gate and one end of said transformer primary, a capacitor connected between the gate of said first transistor and the base of said second transistor, a resistor connected between said one end of said transformer primary and said second transistor base, thereby providing that alternating current through said transformer primary turns said second transistor on, discharging said capacitor and turning off said first transistor to prevent half-cycle clamping of current through said transformer primary, and that when alternating current is not provided through said transformer primary, said second transistor turns off, allowing said capacitor to charge and providing a unidirectional current path through said first diode and said first transistor to effect said half-cycle clamping.

* * * * *